United States Patent [19]

Ueno et al.

[11] Patent Number: 4,722,881

[45] Date of Patent: Feb. 2, 1988

[54] RADIATION-SENSITIVE RESIST COMPOSITION WITH AN ADMIXTURE OF CIS-(1,3,5,7-TETRAHYDROXY)-1,3,5,7-TETRAPHENYLCYCLOTETRASILOXANE AND A POLYSILSESQUIOXANE

[75] Inventors: Takumi Ueno; Hiroshi Shiraishi, both of Hachioji; Takashi Nishida, Taito; Nobuaki Hayashi, Iruma, all of Japan

[73] Assignee: Hitachi, Ltd., Tokyo, Japan

[21] Appl. No.: 809,203

[22] Filed: Dec. 16, 1985

[30] Foreign Application Priority Data

Dec. 19, 1984 [JP] Japan ................. 59-266103

[51] Int. Cl.$^4$ .................. G03C 1/60; G03C 1/71
[52] U.S. Cl. .................. 430/192; 430/156; 430/165; 430/166; 430/167; 430/197; 430/270; 430/272; 430/280; 430/281; 430/296; 430/313; 430/323; 430/325; 430/326; 430/966; 430/967
[58] Field of Search ............. 430/192, 191, 190, 193, 430/156, 312, 197, 270, 280, 281, 272, 165, 166, 167

[56] References Cited

U.S. PATENT DOCUMENTS

| | | | |
|---|---|---|---|
| 3,953,212 | 4/1976 | Miyano et al. | 430/192 |
| 4,379,826 | 4/1983 | Economy et al. | 430/192 |
| 4,389,281 | 6/1983 | Anantha | 156/646 |
| 4,395,527 | 7/1983 | Berger | 428/447 |
| 4,399,266 | 8/1983 | Matsumura et al. | 528/14 |
| 4,464,460 | 8/1984 | Hiraoka et al. | 156/643 |
| 4,481,049 | 11/1984 | Reichmanis et al. | 430/312 |
| 4,510,283 | 4/1985 | Takeda et al. | 528/39 |
| 4,524,121 | 6/1985 | Gleim et al. | 430/192 |
| 4,563,241 | 1/1986 | Taneka et al. | 156/643 |
| 4,600,685 | 7/1986 | Kitakohji et al. | 430/270 |
| 4,657,843 | 4/1987 | Fukuyama et al. | 430/270 |

FOREIGN PATENT DOCUMENTS

| | | | |
|---|---|---|---|
| 164598 | 12/1985 | European Pat. Off. | 430/270 |
| 58-48045 | 3/1983 | Japan | 430/190 |
| 96654 | 6/1983 | Japan | 430/270 |
| 198446 | 11/1984 | Japan | 430/270 |
| 117242 | 6/1985 | Japan | 430/270 |

OTHER PUBLICATIONS

Conant, D. H., *Research Disclosure*, #13147, 3/1975, pp. 52-53.

*Primary Examiner*—Charles L. Bowers, Jr.
*Attorney, Agent, or Firm*—Antonelli, Terry & Wands

[57] ABSTRACT

This invention relates to a radiation-sensitive composition having resistance to oxygen reactive-ion etching and a process for forming a pattern by using the same.

The radiation-sensitive composition of this invention comprises a mixture of cis-(1,3,5,7-tetrahydroxy)-1,3,5,7-tetraphenylcyclotetrasiloxane and a polysilsesquioxane, said mixture containing 5 to 100 wt. % of cis-(1,3,5,7-tetrahydroxy)-1,3,5,7-tetraphenylcyclotetrasiloxane, and a resist containing a phenolic resin soluble in an aqueous alkali solution.

8 Claims, 1 Drawing Figure

RADIATION-SENSITIVE RESIST COMPOSITION WITH AN ADMIXTURE OF CIS-(1,3,5,7-TETRAHYDROXY)-1,3,5,7-TETRAPHENYLCYCLOTETRASILOXANE AND A POLYSILSESQUIOXANE

BACKGROUND OF THE INVENTION

This invention relates to a composition resistant to radiations such as ultraviolet rays, electron beams, ion beams or X-rays and a process for forming a pattern by using the same. More particularly, this invention relates to a radiation-sensitive composition suitable for use in fine processing and excellent in resistance to dry etching and a process for forming a pattern by using the same.

In recent years, oxygen reactive-ion etching (RIE) techniques utilizing a resist material have been attempted. For example, an attempt has been made to etch insulation layers of semiconductors or the like by oxygen RIE. However, conventional resist materials themselves are lacking in resistance to oxygen RIE, so that they are lost or deformed by etching before the etching of the layer to be processed is completed.

Besides, in the fine processing of semiconductor elements, the substrates have a complicated unevenness in surface levels. In order for a resist film to cover such unevenness and withstand the subsequent dry etching step, it is preferable that the resist film has the largest possible thickness. On the other hand, the resolution of a resist depends on its thickness and it is desirable that the resist is thinner. As minimum feature sizes are reduced, it becomes more and more difficult to fulfil these contradictory requirements by using a single-layer resist system. In order to overcome these problems, a variety of multilayer resist systems were proposed. The two-layer resist system of this invention is also one of these multilayer systems. The structure comprises a lower thick flat layer and an upper resist film layer, and a film resistant to oxygen RIE is used as the resist film. However, no resist film that has high resolution and high practicality as well as resistance to oxygen RIE has been available.

An example of a resist having some resistance to oxygen RIE is a positive resist containing a polysilsesquioxane (Japanese Patent Laid-Open No. 14161/1982). However, when this resist contains 10 wt. % or more of the polysilsesquioxane, the resolution is worsened. When it contains below 10 wt. % of the polysilsesquioxane, the resistance to oxygen RIE is not fully satisfactory.

SUMMARY OF THE INVENTION

It is an object of this invention to provide a radiation-sensitive composition which can form a fine pattern and has excellent resistance to oxygen RIE and a process for forming a pattern by using the same.

These and other objects can be achieved by a radiation-sensitive composition comprising a mixture of cis-(1,3,5,7-tetrahydroxy)-1,3,5,7-tetraphenylcyclotetrasiloxane and a polysilsesquioxane represented by the general formula:

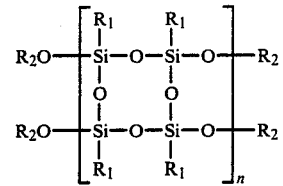

(wherein $R_1$ represents at least one kind of a substituent selected from the group consisting of a phenyl group and an alkyl group of 1 to 4 carbon atoms with the phenyl group to alkyl group ratio being equal to or greater than 1, $R_2$ is at least one element or substituent selected from the group consisting of hydrogen, a phenyl group, and an alkyl group of 1 to 4 carbon atoms with the number of hydrogen atoms being equal to at least one half of the total number of $R_2$ substitments), said mixture containing 5 to 100 wt. % of the cis-(1,3,5,7-tetrahydroxy)-1,3,5,7-tetraphenylcyclotetrasiloxane, and a resist containing a phenolic resin soluble in an aqueous alkali solution.

DETAILED DESCRIPTION OF PREFERRED EMBODIMENTS

Figure 1:
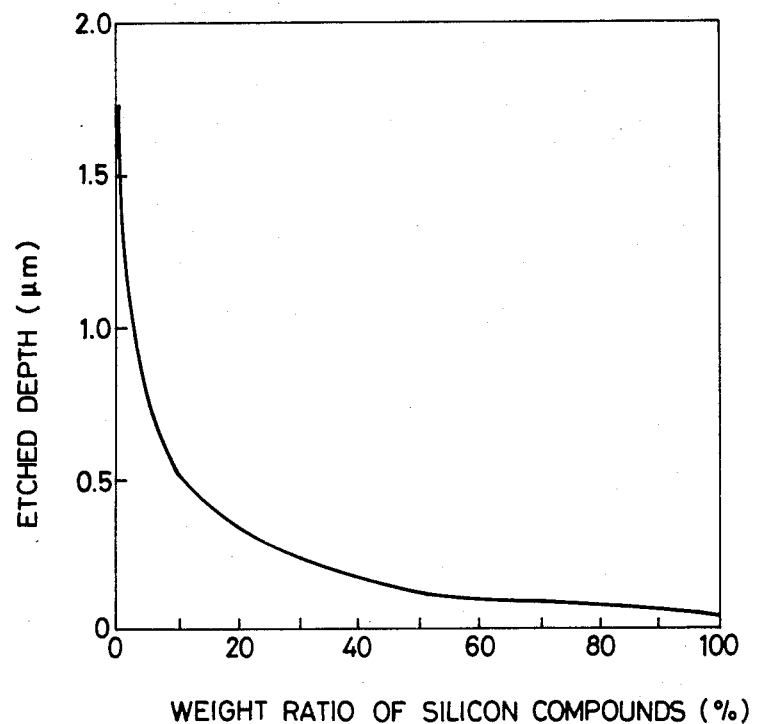
FIG. 1 is a graph illustrating the effect of this invention.

A coating film of a resist containing an alkali-soluble phenolic resin is suitable for forming a fine pattern but is lacking in resistance to oxygen RIE.

On the other hand, a coating film containing a polysilsesquioxane has resistance to oxygen RIE, but the polysilsesquioxane itself can not function as a resist and is difficultly soluble in an aqueous alkali solution. Therefore, if it is used in admixture with the above resist, the formation of a fine pattern becomes difficult.

The cis-(1,3,5,7-tetrahydroxy)-1,3,5,7-tetraphenylcyclotetrasiloxane (hereinafter abbreviated as phenyl-$T_4(OH)_4$) is soluble in an aqueous alkali solution and can form a photosensitive composition having resistance to oxygen RIE when it is mixed with a resist containing an alkali-soluble phenolic resin.

Although the polysilsesquioxane is difficultly soluble in an aqueous alkali solution, a mixture of this compound with phenyl-$T_4(OH)_4$ is soluble in an aqueous alkali solution. Here, it is necessary that at least one half of $R_2$ substituents in said general formula are hydrogen atoms, and it is preferable that the amount of phenyl-$T_4(OH)_4$ is at least 5 wt. % based on the mixture. When the amount of phenyl-$T_4(OH)_4$ is 10 wt. % or above based on the mixture, the mixture is more readily soluble in an aqueous alkali solution, which is preferable. As mentioned above, even the use of phenyl-$T_4(OH)_4$ alone is not objectionable as far as the resistance to oxygen RIE is concerned. However, because the polysilsesquioxane has better film properties than phenyl-$T_4(OH)_4$, it is desirable to use a mixture of these compounds. Therefore, although effectiveness can be recognized when the amount of phenyl-$T_4(OH)_4$ in the silicon compound mixture is in the range of from 5 to 100 wt. %, this amount of preferably in the range of from 5 to 80 wt. %, particularly preferably in the range of from 10 to 80 wt. %.

On the other hand, in order for the polysilsesquioxane to be compatible with the alkali-soluble phenolic resin, it is preferably that the phenyl group to alkyl group ratio of $R_1$, substituents in the general formula of the polysilsesquioxane is equal to or greater than 1.

The value of n a degree of polymerization) in the general formula is an integer or a number equal to an integer plus 0.5. Namely, values such as 1.5 and 2.5 may be included. A compound having n of 1.5 is one having the following formula:

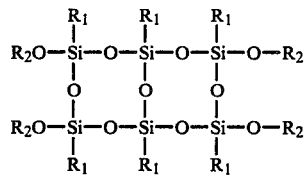

FIG. 1 shows the results of an examination on the resistance of a coating film of a composition containing the above silicon compounds and the resist to oxygen reactive-ion etching (RIE). A coating film of a composition comprising a silicon compound mixture composed of 95 wt. % of a polyphenylsilsesquioxane ($R_1$ is phenyl in the general formula), Glass Resin GR-950 (a product of Owens-Illinois, Inc., degree of polymerization of 2.5) and 5 wt. % of phenyl-$T_4(OH)_4$ and a positive photoresist OFPR (a product of Tokyo Oka Co., Ltd.; principal components: novolac resin and quinone diazide) was baked at 200° C. for 20 minutes and then subjected to oxygen RIE. The conditions for oxygen RIE included an oxygen pressure of $2 \times 10^{-3}$ Torr, a RF frequency of 13.56 MHz, a supply power of 100W, and a RF power supply time of 40 minutes. In the graph, an abscisa represents a weight ratio of the total of silicon compounds and OFPR-800 (solid content). This graph shows that the etching depth of the film was 0.5 μm or more when the amount of the silicon compound mixture was below 0.1 by weight ratio. This means that even when the film has a thickness of 1 μm, more than a half of its thickness is reduced by etching. Therefore, as will be described in detail hereinafter, this causes a dimensional shift in a two-layer resist system having this composition as the upper layer when the upper layer pattern is transferred to a lower layer film by oxygen RIE. Therefore, the amount of the silicon compound mixture is preferably 0.1 or above by weight ratio, particularly preferably 0.2 or above. Of course, it is impossible to form a resist image when the silicon compounds are used alone, and the formation of an image becomes difficult when the weight ratio of the silicon compound mixture exceeds 0.95. Therefore, the amount of the silicon compound mixture is desirably 0.95 or below by weight ratio, and because of sensitivity and easiness of image formation, it is more desirably 0.8 or below, most desirably 0.7 or below. Therefore, the amount of the silicon compound mixture is desirably in the range of from 0.1 to 0.95, more desirably in the range of from 0.2 to 0.8.

The resist to be mixed with the silicon compound mixture may be positive or negative one so long as it contains a phenolic resin soluble in an aqueous alkali solution. Examples of these phenolic resins include poly(vinylphenol), novolac resin and their halogenated derivatives. A mixture of at least two of them can also be used.

An example of a positive photoresist is one comprising a quinone diazide and a phenolic resin. The both components may be used in amounts to provide a conventional ratio, usually a weight ratio of the phenolic resin to the quinone diazide of about 1:0.05 to 1.

Examples of the quinone diazides include compounds represented by the general formula:

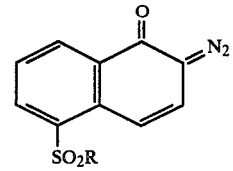

wherein R represents a substituent such as

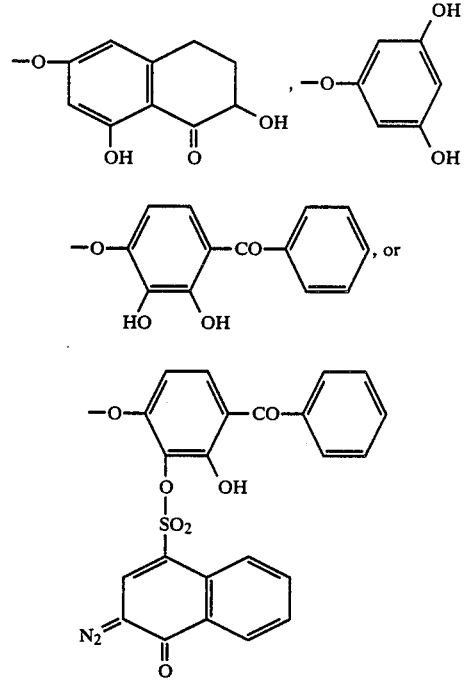

In addition to the above compounds, those quinone diazides which are used in radiation-sensitive compositions can also be used. They include quinone diazides represented by the above general formula, wherein R is other than the abovementioned. Further, a mixture of at least two of these can also be used.

Another example of a positive resist is one comprising a poly(olefin sulfone) and a phenolic resin. In this case also, the both components can be used in amounts to provide a conventional ratio, usually a weight ratio of the phenolic resin to the poly(olefin sulfone) of about 1:0.05 to 0.35.

An example of the poly(olefin sulfone) is poly(2-ethylpentene-1-sulfone). Of course, in addition to this, those poly(olefin sulfone)s which are used in radiation-sensitive compositions can also be used, and so is a mixture of at least two of these compounds.

Examples of negative resists which can be used include those comprising an azide and a phenolic resin. In this case also, the both components can be used in amounts to provide a conventional ratio, usually a weight ratio of the phenolic resin to the azide of about 1:0.02 to 1, preferably 1:0.1 to 0.5.

Examples of the azides include 3,3'-diazidodiphenyl sulfone, 4-azidochalcone, 2,6-bis(4'-azidobenzal)-4- methylcyclohexane, 1,4'-azidobenzylidene-3-α-hydroxy-4"-azidobenzylindene, 3-[4'-(p-azidophenyl)-vinylene]-5,5- dimethyl-2-cyclohexen-1-one, and 3-[p-azidophenyl)-1', 3'-butadienyl]-5,5-dimethyl-2-cyclohexen-1-one.

Further, it is also possible to select an appropriate azide so that it fits to the wavelength of light used in an optical printer. In addition to the above azides, those azides which are used in photosensitive compositions can also be used, and so is a mixture of at least two of them.

Other examples of negative resists include those comprising an azide, an epoxy group-containing compound and a phenolic resin. In this case also, the above-mentioned azides are used. Examples of the epoxy group-containing compounds include epoxy resin (bisphenol A type), brominated epoxy resin (bisphenol A type), epoxy novolac resin, brominated epoxy novolac resin, and epoxy resin (polyglycol type). In addition, those compounds which are used in radiation-sensitive compositions can also be used, and so is a mixture of at least two of them. These compounds can be used in amounts to provide a conventional ratio, usually a weight ratio of the phenolic resin to the azide and the epoxy group-containing compound of about 1:0.02 to 1:0.05 to 1, preferably about 1:0.1 to 0.5:0.1 to 1.

In addition, other resists containing a phenolic resin soluble in an aqueous alkali solution can also be used.

An example in which the radiation-sensitive composition of this invention is used at the upper resist layer of a two-layer resist will now be described.

The two-layer resist system according to this invention can be used in a process for processing a thick organic film or in forming a resist pattern of a high aspect ratio in processing a substrate. First, a lower organic film layer having a thickness sufficient to cover the unevenness in the surface level of a substrate is formed on the substrate by spin coating.

Next, the above radiation-sensitive composition of this invention is applied to the organic film layer by spin coating to form an upper resist film layer. The formed resist film layer is exposed to a radiation having a desired pattern and then developed to form the desired pattern. Next is a process for transferring the pattern by using the upper pattern layer containing silicon as a mask and etching the lower organic film layer with oxygen RIE. The above organic materials which are directly applied to a substrate for use as a lower layer may be any organic polymeric materials so long as they can be removed by oxygen RIE. For example, mention can be made of styrene polymers such as polystyrene, poly(4-chlorostyrene), poly(4-bromostyrene), and poly(vinylbenzyl chloride), polyimides such as PIQ (trademark of Hitachi Chemical Co., Ltd.), polyacrylates such as poly(methyl methacrylate), poly(glycidyl methacrylate), poly(ethyl acrylate), and poly(2-chloroethyl acrylate), phenolic resins such as poly(vinylphenol) and phenol novolac resin, and rubbers such as polybutadiene. Even a well-known radiation-sensitive composition containing these can also be applied so long as it can be removed by oxygen RIE.

Other requisites for the lower organic film layer are that no admixture occurs between the upper and the lower layers during the resist coating, the organic film is insoluble in a developer for the resist and, when used as a protective film for etching a substrate, the lower layer can withstand during etching the substrate, etc.

This invention will now be described in detail with reference to examples.

EXAMPLE 1

The cis-(1,3,5,7-tetrahydroxy)-1,3,5,7-tetraphenylcyclotetrasiloxane (hereinafter abbreviated as phenyl-$T_4(OH)_4$) was synthesized according to the method of J. F. Brown, Jr. (J. Am. Chem. Soc., 87(19), 4317–4324 (1965)). A resist solution for an upper layer was prepared by adding 1 part by weight of phenyl-$T_4(OH)_4$ and 19 parts by weight of a polyphenylsilsesquioxane (a product of Owens-Illinois, Inc., Glass Resin GR-950) to 160 parts by weight of a commercially available positive photoresist solution OFPR mainly consisting of a novolac resin and a quinone diazide (solid concentration of 25 wt. %, a product of Tokyo Ohka Kogyo Co., Ltd.).

A resist solution comprising a commercially available positive photoresist OFPR-800-30 (a product of Tokyo OhkaKogyo Co., Ltd., viscosity of 30 cP) was applied to a silicon wafer and baked at 200° C. for 20 minutes to form an organic lower layer film having a thickness of 1.5 μm. A sample for optical printing was prepared by applying the above resist to the organic film by spin coating and baking it in air at 60° C. for 20 minutes to form an upper resist layer of a thickness of 0.9 μm. The above sample was exposed to light of a predetermined pattern by means of a Hitachi Reduction Projection Aligner RA 101 HL and immersed in an aqueous organic alkali solution (3 wt. % aqueous tetramethylammonium hydroxide solution) as a developer to develop the resist film and obtain a positive pattern. The obtained resist pattern was transferred to the lower organic film layer through the resist pattern as a protective film by oxygen RIE (oxygen pressure of $2 \times 10^{-3}$ Torr, RF frequency of 13.56 MHz, supply power of 100 W and RF power supply time of 40 minutes) by means of a sputtering system which was a modification of a sputtering system (Model FP-67 A, a product of NEVA Corp.). The sample was taken out, and its microscopic examination revealed that the part of the lower layer correspondign to the protective film-free part of the upper resist layer could be completely removed to form an organic lower layer pattern which could reflect the resist pattern with high fidelity.

EXAMPLE 2

This example was carried out in the same manner as in Example 1 except that the polyphenylsilsesquioxane used in Example 1 was replaced with a polyphenylmethylsilsesquioxane (phenyl group/methyl group ratio =4/1, a product of Owens-Illinois, Inc., Glass Resin GR-908). An organic lower layer film pattern which could reflect the upper layer resist pattern with high fidelity could be formed.

EXAMPLE 3

This example was carried out in the same manner as in Example 1 except that the polyphenylsilsesquioxane used in Example 1 was replaced with a polyphenylmethylsilsesquioxane (phenyl group/methyl group ratio=1/1, a product of Owens-Illinois, Inc., Glass Resin GR-150). An organic lower layer film pattern which could reflect the upper layer resist pattern with high fidelity could be formed.

EXAMPLE 4

A resist solution for an upper layer was prepared by adding 1 part by weight of phenyl-$T_4(OH)_4$ synthesized in Example 1 and 9 parts by weight of a polyphenylsilsesquioxane (a product of Owens-Illinois, Inc., Glass Resin GR-950) to 80 parts by weight of a positive photoresist solutioh OFPR-800 (solid concentration of 25 wt. %, a product of Tokyo ohka Kogyo Co., Ltd.).

A sample for optical printing was prepared by applying the above resist by spin coating to an organic film (1.5 μm thick) formed on a silicon wafer in the same manner as in Example 1 and baking it in air at 60° C. for 20 minutes to form an upper resist film layer of a thickness of 0.9 μm. This sample was exposed to light of a predetermined pattern in the same manner as in Example 1 and then immersed in an aqueous organic alkali solution (3 wt. % aqueous tetramethylammonium hydroxide solution) as a developer for 45 seconds to develop the resist film and obtain a positive pattern. This sample was subjected to oxygen RIE by using the resist pattern as a protective film in the same manner as in Example 1, whereupon an organic film pattern which could reflect the resist pattern with high fidelity could be formed.

EXAMPLE 5

A resist solution for an upper layer was prepared by adding 1 part by weight of phenyl-$T_4(OH)_4$ synthesized in Example 1 and 1 part by weight of a polyphenylsilsesquioxane (a product of Owens-Illinois, Inc., Glass Resin GR-950) to 16 parts by weight of a positive photoresist solution OFPR-800 (solid concentration of 25 wt. %, a product of Tokyo Ohka Kogyo Co., Ltd.). A sample for optical printing was prepared by applying the above 1 resist by spin coating to an organic film (1.5 μm thick) formed on a silicon wafer in the same manner as in Example 1 and baking it in air at 60° C. for 20 minutes to form an upper resist layer of a thickness of 0.9 μm. This sample was exposed to light of a predetermined pattern in the same manner as in Example 1 and immersed in an aqueous organic alkali solution (2.38 wt. % aqueous tetramethylammonium hydroxide solution) as a developer for 110 seconds to develop the resist film and obtain a positive pattern. This sample was subjected to oxygen RIE by using the obtained pattern as a protective film in the same manner as in Example 1, whereupon an organic film pattern which could reflect the resist pattern with high fidelity could be formed.

EXAMPLE 6

A resist solution for an upper layer was prepared by adding 6 parts by weight of phenyl-$T_4(OH)_4$ synthesized in Example 1 and 9 parts by weight of a polyphenylsilsequioxane (a product of Owens-Illinois, Inc., Glass Resin GR-950) to 80 parts by weight of a positive photoresist solution OFPR-800 (solid concentration of 25 wt. %, a product of Tokyo Ohka Kogyo Co., Ltd.). A sample for optical printing was prepared by applying the above resist by spin coating to an organic film (1.5 μm thick) as a lower layer formed on a silicon wafer in the same manner as in Example 1 and baking it in air at 60° C. for 20 minutes to form an upper resist film layer of a thickness of 0.9 μm. This sample was exposed to light of a predetermined pattern in the same manner as in Example 1 and immersed in an aqueous organic alkali solution (2.5 wt % aqueous tetrameethylammonium hydroxide solution) as a developer for 60 seconds to develop the resist film and obtain a positive pattern. This sample was subjected to oxygen RIE by the obtained pattern as a protective film in the same manner as in Example 1, whereupon an organic film pattern which could reflect the resist pattern with high fidelity could be formed.

EXAMPLE 7

A resist solution for an upper layer was prepared by adding 1 part by weight of phenyl-$T_4(OH)_4$ synthesized in Example 1 to 8 parts by weight of a positive photoresist solution OFPR-800 (solid concentration of 25 wt. %, a product of Tokyo Oka Co., Ltd.).

A sample for optical printing was prepared by applying the above resist by spin coating to an organic film (1.5 μm thick) as a lower layer formed on a silicon wafer in the same manner as in Example 1 and baking it in air at 60° C. for 20 minutes to form an upper resist film layer of a thickness of 0.9 μm. This sample was exposed to light from a 600 W Xe-Hg lamp for 5 seconds through the test pattern mask and then developed in a 1.2 wt. % aqueous tetramethylammonium hydroxide solution as a developer to obtain a positive pattern. This sample was subjected to oxygen RIE by using the obtained pattern as a protective film in the same manner as in Example 1, whereupon an organic film pattern which could reflect the resist pattern with high fidelity could be formed.

EXAMPLE 8

A resist solution for an upper layer was prepared by adding 1 part by weight of phenyl-$T_4(OH)_4$ synthesized in Example 1 and 19 parts by weight of polyphenylsilsesquioxane (a product of Owens-Illinois, Inc., Glass Resin GR-950) to 154 parts by weight of a commercially available negative deep UV resist solution mainly consisting of poly(p-vinylphenol) and an azide, RD-2000N (Solid concentration of 23 wt. %, a product of Hitachi Chemical Co., Ltd.). A sample for optical printing was prepared by applying the above resist by spin coating to an organic film (1.5 μm thick) as a lower layer formed on a silicon wafer in the same manner as in Example 1 and baking it in air at 60° C. for 20 minutes to form an upper resist film layer of a thickness of 0.9 μm. This sample was exposed to light from a 600 W Xe-Hg lamp for 5 seconds through the test pattern mask and then developed in a 0.95 wt. % aqueous tetramethylammonium hydroxide solution as a developer to obtain a negative pattern. This sample was subjected to oxygen RIE by using the obtained resist pattern as a protective film in the same manner as in Example 1, whereupon an organic film pattern which could reflect the toplayer resist pattern with high fidelity could be formed.

EXAMPLE 9

A resist solution for an upper layer was prepared by adding 2 parts by weight of phenyl-$T_4(OH)_4$ synthesized in Example 1 and 3 parts by weight of a polyphenylsilsequioxane (a product of Owens-Illinois, Inc., Glass Resin GR-950) to 70 parts by weight of a commercially available positive electron beam resist solution RE-5000 P mainly consisting of a novolac resin and poly(2-methylpentene-1 solfone) (solid concentration of 14.5 wt. %, a product of Hitachi Chemical Co., Ltd.).

The obtained resist solution was applied by spin coating to an organic film (1.5 μm thick) as a lower layer formed on a silicon wafer in the same manner as in Example 1 and baked in air at 60° C. for 20 minutes to form an upper resist film layer of a thickness of 0.9 μm. The obtained sample wafer was exposed to electron beams of a test pattern by using an electron beam exposure system under conditions including an acceleration voltage of 30 kV and an electron beam dose of $4.0 \times 10^{-6}$ C/cm2 and immersed in a 3 wt. % aqueous tetramethylammonium hydroxide solution as a developer to develop the resist film and obtain a positive pattern. This sample was subjected to oxygen RIE by using the obtained resist pattern as a protective film in the same manner as in Example 1, whereupon an organic film pattern which could reflect the resist pattern with high fidelity could be formed.

EXAMPLE 10

A resist solution for an upper layer was prepared by dissolving 4 parts by weight of a poly(p-vinylphenol) of a weight-average molecular weight of about 7000, 1 part by weight of 3,3'-diazidodiphenyl sulfone, 5 parts by weight of phenyl-$T_4(OH)_4$ synthesized in Example 1, and 90 parts by weight of a polyphenylsilsesquioxane (a product of Owens-Illinois, Inc., Glass Resin GR-950) in 300 parts by weight of cyclohexanone.

The obtained resist was applied by spin coating to an organic film (1.5 μm thick) as a lower layer formed on a silicon wafer in the same manner as in Example 1 and then baked in air at 80° C. for 20 minutes to form a resist film of a thickness of 1.1 μm. This sample wafer was exposed to electron beams of a test pattern by using an electron beam exposure system under conditions including an acceleration voltage of 30 kV and an electron beam dose of $1.5 \times 10^{-5}$ C/cm² and immersed in a 1.2 wt. % aqueous tetramethylammonium hydroxide solution as a developer to develop the resist film and obtain a negative pattern. This sample wa subjected to oxygen RIE by using the obtained resist pattern as a protective film in the same manner as in Example 1, whereupon an organic film pattern which could reflect the resist pattern with high fidelity could be formed. EXAMLE 11

A resist solution for an upper layer was prepared by dissolving 27 parts by weight of poly(p-vinylphenol) of a weight-average molecular weight of about 7000, 5 parts by weight of 3,3'-diazidophenyl sulfone, 8 parts by weight of an epoxy novolac resin DEN-431 (a product of Dow Chemical Japan Ltd.), 1 part by weight of phenyl-$T_4(OF)_4$ synthesized in Example 1 and 19 parts by weight of a polyphenylsilsesquioxane (a product of Owens-Illinois, Inc., Glass Resin GR-950) in 150 parts by weight of cyclohexane.

The obtained resist was applied by spin coating to an organic film (1.5 μm thick) as a lower layer formed on a silicon wafer in the same manner as in Example 1 and then baked in air at 80° C. for 20 minutes to form a resist film of a thickness of 1.0 μm. This sample wafer was exposed to electron beams of a test pattern by using an electron beam exposure system under conditions including an acceleration voltage of 30 kV and an electron beam dose of $1.0 \times 10^{-5}$ C/cm² and immersed in a 1.2 wt. % aqueous tetramethylammonium hydroxide solution as a developer to develop the resist film and obtain a negative pattern. This sample was subjected to oxygen RIE by using the obtained resist pattern as a protective film in the same manner as in Example 1, whereupon an organic film pattern which could reflect the resist pattern with high fidelity could be formed.

As having been described above in detail, the resist film formed from the radiation-sensitive composition of this invention can form a pattern by exposure to radiations such as visible light, ultraviolet light electron beams, ion beams, or X rays, and can exhibit resistance to oxygen RIE, so that it can be used to process a thick organic film at high resolution and is particularly suited for the fine processing of substrates having surface unevenness.

When compared with a prior art three-layer resist system the two-layer resist of this invention is simpler in respect of a process for forming a resist pattern, so that is of great practicality.

What is claimed is:

1. A radiation-sensitive composition comprising an admixture of a radiation or electron beam positive or negative resist and a mixture of cis-(1,3,5,7-tetrahydroxy)-1,3,5,7-tetraphenylcyclotetrasiloxane and a polysilsesquioxane represented by the general formula:

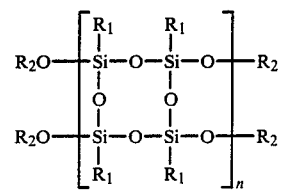

wherein $R_1$ represents at least one kind of a substituent selected from the group consisting of a phenyl group and an alkyl group of 1 to 4 carbon atoms, with the phenyl group to alkyl group ratio being equal to or greater than 1, $R_2$ is at least one substituent selected from the group consisting of hydrogen, a phenyl group, and an alkyl group of 1 to 4 carbon atoms, with the number of hydrogen atoms being equal to at least one half of the total number of $R_2$ substituents, said mixture containing 5 to 100 wt. % of the cis-(1,3,5,7-tetrahydroxy)-,3,5,7-tetraphenylcyclotetrasiloxane, and said resist containing a phenolic resin soluble in an aqueous alkali solution; the ratio of said mixture to said resist being such that said mixture is present in a weight ratio in the range of from 0.1 to 0.95.

2. A radiation-sensitive composition according to claim 1, wherein said resist is a positive photoresist and comprises a quinone diazide and a phenolic resin, the weight ratio of the phenolic resin to the quinone diazide being about 1:0.05 to 1.

3. A radiation-sensitive composition according to claim 1, wherein said resist is a negative resist and comprises an azide and a phenolic resin, the weight ratio of the phenolic resin to the azide being about 1:0.02 to 1.

4. A radiation-sensitive composition according to claim 1, wherein said resist is a negative resist and comprises an azide, an epoxy group-containing compound and a phenolic resin.

5. A radiation-sensitive composition according to claim 1, wherein said resist is a positive resist and comprises a poly(olefin sulfone) and a phenolic resin.

6. A radiation-sensitive composition according to claim 1, wherein the value of n is an integer or a number equal to the integer plus 0.5.

7. A radiation-sensitive composition according to claim 1, wherein the mixture contains 5 to 80 wt. % of the cis-(1,3,5,7- tetrahydroxy)-1,3,5,7-tetraphenylcyclotetrasiloxane, the remainder of the mixture consisting of the polysilsesquioxane.

8. A radiation-sensitive composition according to claim 1, wherein said mixture contains 10 to 80 wt % of the cis-(1,3,5,7- tetrahydroxy)-1,3,5,7-tetraphenylcyclotetrasiloxane and the remainder of the mixture consisting of the polysilsesquioxane.

* * * * *